(12) United States Patent
Keinert et al.

(10) Patent No.: US 8,495,547 B2
(45) Date of Patent: Jul. 23, 2013

(54) PROVIDING SECONDARY POWER PINS IN INTEGRATED CIRCUIT DESIGN

(75) Inventors: Joachim Keinert, Altdorf (DE); Douglass T. Lamb, Cary, NC (US); Peter J. Osler, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 12/910,336

(22) Filed: Oct. 22, 2010

(65) Prior Publication Data

US 2011/0113398 A1 May 12, 2011

(51) Int. Cl.
*G06F 17/50* (2006.01)

(52) U.S. Cl.
USPC .......................................... 716/120; 716/126

(58) Field of Classification Search
USPC ........... 716/120, 126, 127, 129, 130; 257/206
See application file for complete search history.

(56) References Cited

U.S. PATENT DOCUMENTS

| 7,240,314 | B1 | 7/2007 | Leung |
| 7,275,222 | B2 | 9/2007 | Douriet |
| 7,328,419 | B2 | 2/2008 | Vuong et al. |
| 7,462,941 | B2 | 12/2008 | Campbell et al. |
| 7,480,875 | B2 | 1/2009 | Satoh et al. |
| 7,496,877 | B2 | 2/2009 | Huber et al. |
| 7,536,658 | B2 | 5/2009 | Kwon et al. |
| 2007/0246827 | A1 | 10/2007 | Owa |
| 2008/0066026 | A1 | 3/2008 | Tai et al. |
| 2009/0072888 | A1 | 3/2009 | Ogata |
| 2009/0244948 | A1* | 10/2009 | Hung et al. ............... 365/51 |
| 2012/0012895 | A1* | 1/2012 | Or-Bach et al. ........... 257/204 |

OTHER PUBLICATIONS

Zhao et al., "Optimal Placement of Power-Supply Pads and Pins", IEEE Transactions on Computer-Aided Design of Integrated Circuits and Systems, vol. 25, No. 1, Jan. 2006, pp. 144-155.
Dubey, "PIG Pad Placement Optimization: Problem Formulation for Best IR Drop", Proceedings of the Sixth International Symposium on Quality Electronic Design, 2005, pp. 1-6.
Kahng et al., "Stochastic Power-Ground Supply Voltage Prediction and Optimization Via Analytical Placement", IEEE Transactions on Very Large Scale Integration (VLSI) Systems, vol. 15, No. 8, Aug. 2007, pp. 904-1002.
Singh et al., "Congetion-Aware Topology Optimizatin of Structured Power/Ground Networks", IEEE Transacitons on Computer-Aided Design of Integrated Circuits and Systems, vol. 24, No. 5, May 2005, pp. 683-696.

* cited by examiner

*Primary Examiner* — Vuthe Siek
(74) *Attorney, Agent, or Firm* — Yee & Associates, P.C.; Libby Z. Toub

(57) ABSTRACT

An integrated circuit (IC) design with multiple metal layers containing cells requiring secondary power supply. After placing the cells and stripes of a primary power/ground grid in metal layers of the IC design, specific cells are provided with secondary power stripes in a first metal layer. The secondary power stripes are designed in such a way that each secondary power/ground stripe exhibits a full overlap with a stripe of a corresponding primary power/ground grid in a different metal layer. Subsequently, signals from the IC design are routed, and power vias between the primary power/ground grid stripes and the secondary power/ground stripes are generated.

11 Claims, 7 Drawing Sheets

PROVIDING SECONDARY POWER PINS IN INTEGRATED CIRCUIT DESIGN

BACKGROUND

1. Field

The invention relates generally to the design of semiconductor integrated circuits (ICs). More specifically, the invention relates to a method for ensuring signal integrity in integrated circuits with multiple metal layers, by introducing a secondary power grid for providing additional supply voltage to logic cells with high power consumption within the design.

2. Description of the Related Art

An integrated circuit (IC) is a device which includes a plurality of electronic components (e.g. transistors, resistors, diodes etc.). These components are interconnected to form multiple circuit components (gates, cells, memory units etc.) on the IC. Modern very large scale integration (VLSI) integrated circuits are typically made up of a layer structure with multiple layers of wiring (called "metal layers") that interconnect its electronic and circuit components. Each metal layer typically has a preferred wiring direction, and the preferred direction alternates between successive metal layers. Many IC designs use the Manhattan wiring model: in each metal layer, all supplies to the IC's electronic and circuit components (i.e. global power supply and global ground) are laid out in a grid of parallel—horizontal or vertical—stripes, and the components connect to these stripes perpendicularly. Designs with multiple metal layers exhibit alternating layers of preferred-direction horizontal and vertical wiring. In a multi-layer design, electrical interconnects (vias) between the metal layers as well as interconnects within the layers allow the IC's components to be connected to the power and ground stripes and to each other, thus completing the circuit.

As part of IC design, logic cells and their connections are defined in terms of a netlist (in a so-called logic synthesis step) and are subsequently placed on the various layers of the chip (in a so-called placement step). Generally, logic cells are cast into standard cells of a predetermined width for vertical circuit rows (or predetermined height for horizontal circuit rows) which are designed and placed in such a way as to align to the power grid stripes on their metal layer; thus, the standard cells residing in a given metal will generally be supplied by the power supply grid of this metal layer.

An important aspect of IC design consists in ensuring signal integrity: If the wire resistance and/or cell current of some cells within the IC exceeds a predetermined limit, voltage drops (aka IR drops) may occur, causing an increase of gate and signal delays and—in the worst case—switching failures of the integrated circuit. Thus, in order to avoid failures caused by signal integrity problems, sufficient electrical power has to be provided to all cells within the integrated circuit.

Various methods of reducing voltage drop in integrated circuits have been suggested:

U.S. Pat. No. 7,240,314 B1 describes a method of introducing metal fill geometries and connecting them to the power mesh using vias or wires at multiple locations. The metal fill geometries thus inserted are electrically connected to the circuit's power mesh structure in a redundant way, thus adding more pathways for current flow between different points of the power mesh. As a consequence, the effective resistance of the power mesh is reduced, resulting in a reduction of voltage drop in the power mesh. An alternate method of implementing metal-fill patterns on integrated circuits, and thus reducing power wiring resistance, is disclosed in U.S. Pat. No. 7,328,419 B2. Note that in both patents the metal fill geometries are introduced after signal wiring, i.e. after completing the layout.

US 2007/0246827 A1 tackles the problem of exceeding power drop within the IC by providing a plurality of first and second power wirings which are confined to different wiring layers and are aligned orthogonal to each other. The plurality of first power wirings and the plurality of second power wirings overlap with each other at a plurality of intersections. Depending on the power requirements of cells fed by the first power wirings, vias are selectively placed on (or removed from) the intersections between the first and second power wirings in an effort to supply sufficient power to all cells within the IC.

U.S. Pat. No. 7,462,941 B2 proposes a design in which the power supply voltages are routed through a mesh of conductive traces which is located in a conducting layer of the integrated circuit and traverses the integrated circuit, e.g. in a diagonal direction. Power is fed to the traces from external voltage sources through a multitude of solder bumps. The traces are designed to provide more direct and more uniform paths to route power supply voltages to the components of the integrated circuit.

U.S. Pat. No. 7,536,658 B2 describes an automated tool (called "power pad synthesizer") for placing/adding chip power supply pads on the periphery of the IC design as well as in interior locations of the IC design in such a way as to reduce maximum power drops of cells within the IC design. An alternate method for placing power-supply pads and pins in integrated circuit design is discussed in "Optimal Placement of Power-Supply Pads and Pins" by Min Zhao et al., IEEE Transactions of Computer Aided Design of Integrated Circuits and Systems, 2006, p. 144-154. Yet another method for placing power supply pads optimally for a given power network is disclosed in "P/G Pad Placement Optimization: Problem Formulation for Best IR Drop" by Aishwarya Dubey, Proceedings of the 6$^{th}$ Int'l Symposium on Quality Electronic Design, 2005.

US 2008/0066026 A1 describes a tool (called "power network analyzer) for identifying intersections and vias of power wires in an integrated circuit device, estimating conductances of vias and wire segments and estimating currents as well as voltage drops within the design. This tool assists human IC designers in detecting unacceptable power drops and improving the design so as to ensure signal integrity.

Furthermore, "Congestion-Aware Topology Optimization of Structured Power/Ground Networks" by Singh and Sapatnekar, IEEE Transactions of Computer Aided Design of Integrated Circuits and Systems, 2005, p. 683-695, proposes usage of locally regular, globally irregular grids for optimizing the design of power/ground networks and minimizing IR drop across the integrated circuit. The power grid chip area is divided into a set of rectangular tiles connected to each other, and a hierarchical circuit analysis approach is applied to identify the tiles containing nodes with the largest IR drops. Starting from an initial configuration with an equal number of wires in each of the rectangular tiles, wires are added using an iterative sensitivity based optimizer. These additional wires are introduced into the respective tile in such a way that they form a mesh of horizontal and vertical conductors covering the tile.

SUMMARY

It is an object of the invention to provide an alternate method for ensuring that the IR drop of each cell within an integrated circuit design is within a predetermined threshold.

The method is local in the sense that it modifies power/ground wirings only in those areas of the integrated circuit in which adequate voltage supply is at risk. Furthermore, it is an object of the invention to provide a system for generating a design layout with a secondary power grid and for generating vias between primary and secondary power grids in such a way that voltage drops within the design are within a predetermined limit.

These objects are achieved by the features of the independent claims. The other claims and the specification disclose advantageous embodiments of the invention. According to a first aspect of the invention, a method for generating a secondary grid for a cell in an integrated circuit with multiple metal layers is provided. Each metal layer of this design contains a primary grid made up of primary stripes. The method comprises the steps of (1) generating a secondary stripe in a given metal layer in such a way that it exhibits a full overlap with a primary stripe in a different metal layer, and (2) placing vias, thus connecting each secondary stripe to the primary grid of the different metal layer. The method may comprise a step of extending a secondary pin of the cell under consideration into a secondary stripe such that this secondary stripe exhibits a full overlap with a primary stripe of the primary grid of the different metal layer.

According to a second aspect of the invention, a method for generating a layout for a design of an electronic circuit with multiple metal layers and multiple cells is provided. The method comprises the steps of (1) placing the cells and stripes (of a primary power/ground grid for the design), (2) providing at least one cell with secondary power stripes such that each secondary power/ground stripe exhibits a full overlap with a stripe of a corresponding primary power/ground grid in a different metal layer, (3) routing signals from the design, and (4) generating power vias between the primary power/ground grid and the secondary power/ground stripes. Steps (3) and (4) may be interchanged.

According to a third aspect of the invention, a computer system for generating a layout for a design of an electronic circuit with multiple metal layers and multiple cells is provided. The system comprises (1) a Cell Placement System for placing the cells, (2) a Primary Power Routing System for placing primary power/ground stripes corresponding to a primary power/ground grid, (3) a Secondary Power Stripe Generating System for providing secondary power/ground stripes in at least one cell, such that each secondary power stripe exhibits a full overlap with a stripe of a corresponding primary power/ground grid in a different metal layer and (3) a Power Vias Generating System for placing vias connecting the primary power/ground grid stripes to the secondary power/ground stripes.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments, wherein is shown in:

FIG. 1b: a schematic representation of a metal layer M3 of the IC design of FIG. 1a with a primary power/ground grid, wherein metal layer M3 is located directly above metal layer M2 of FIG. 1a;

FIG. 3b: a detailed flow diagram of the secondary power/ground grid generating step of FIG. 3a.

Figure 1A:
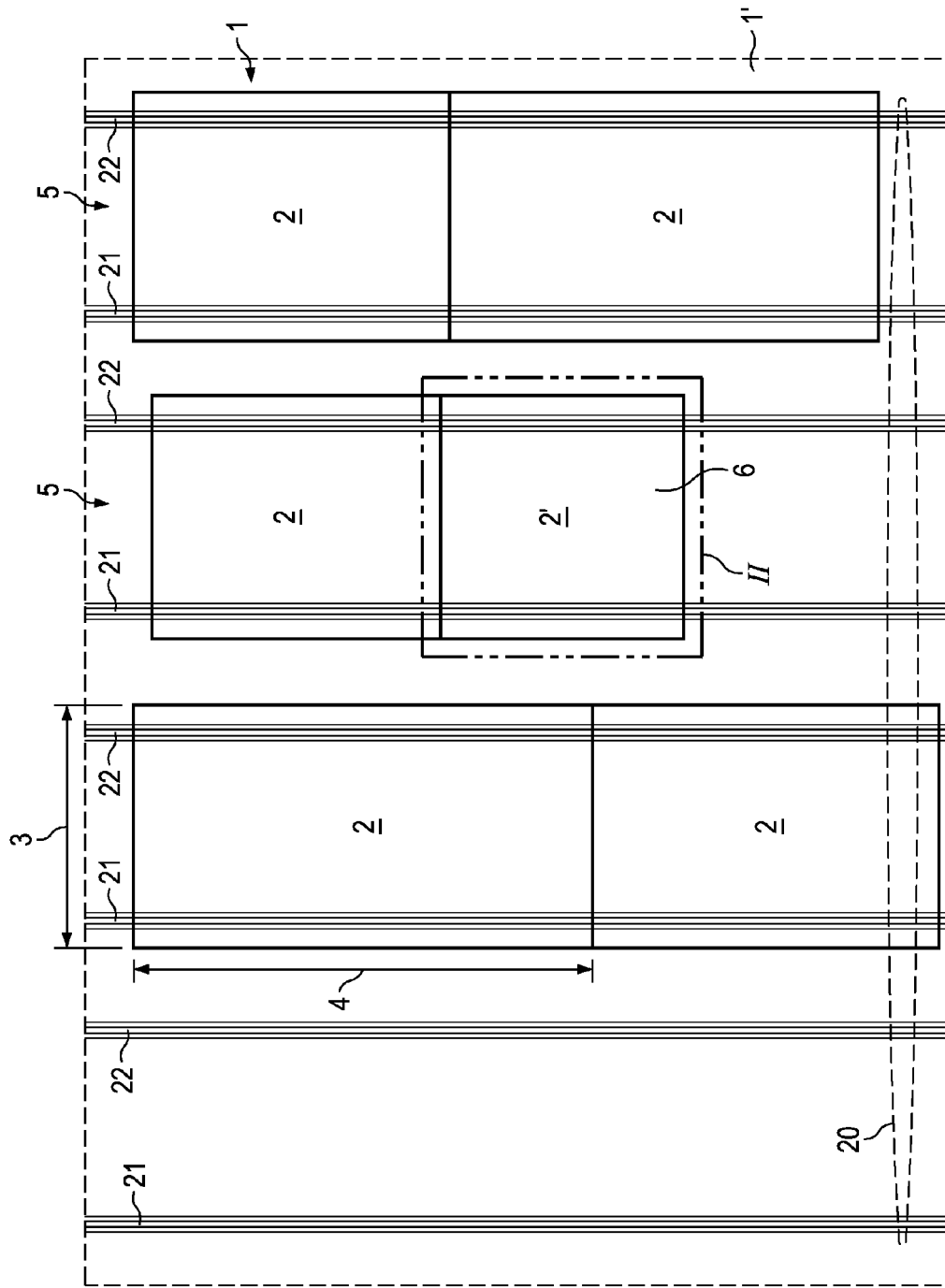
FIG. 1a: a schematic representation of a metal layer M2 of an IC design with a primary power/ground grid and standard cells.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION

Figure 1B:
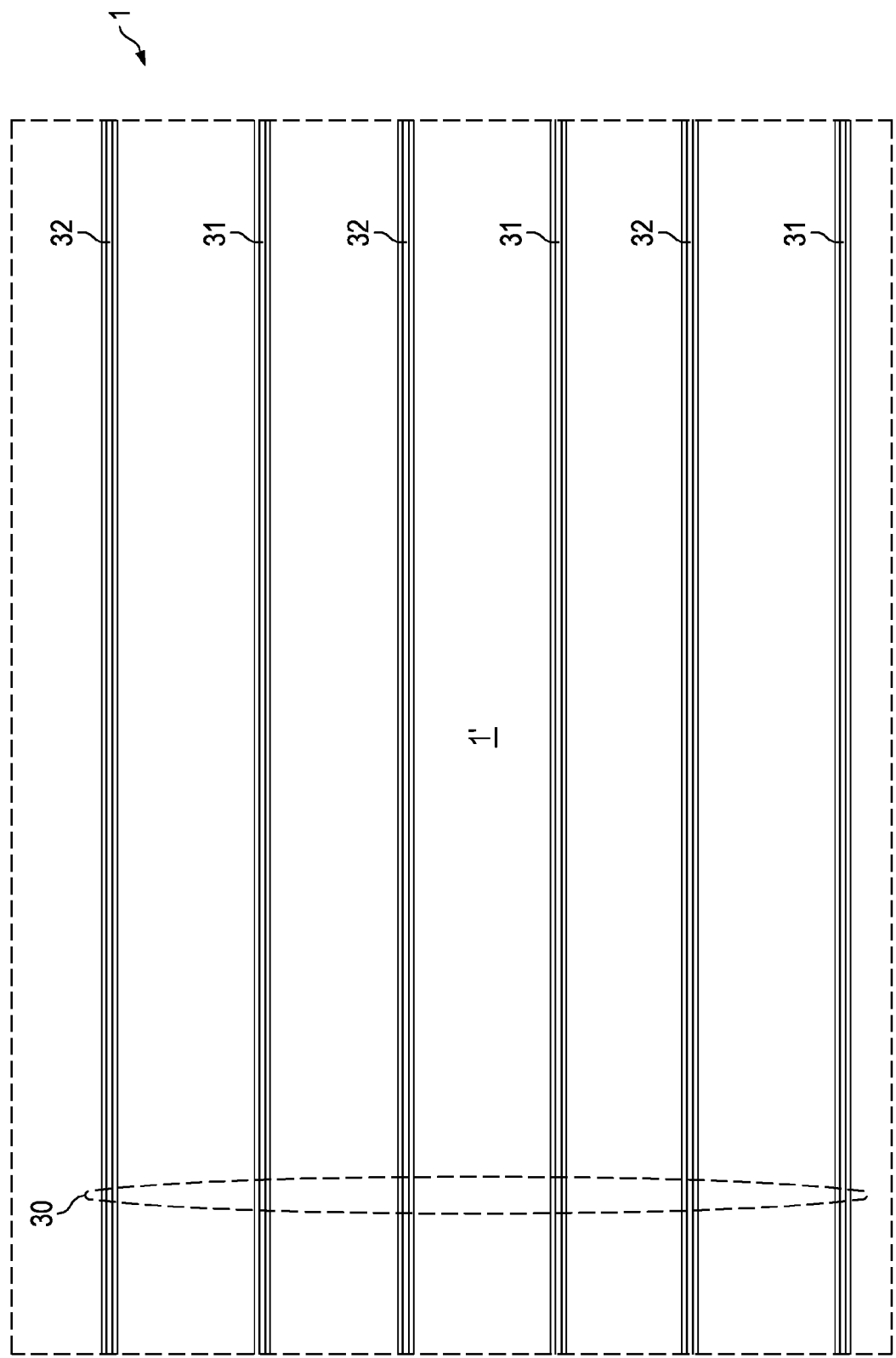

Integrated circuits (ICs) comprise a multitude of electronic and circuit components which are electrically connected to each other using metal interconnects arranged in planar layers (so-called "metal layers" M1, M2, M3, . . . ). Up to ten (or even more) of these metal layers may be stacked on top of each other. Each metal layer comprises a primary power wiring network which is formed by a set of electronically conducting stripes supplying power (vdd) or ground (gnd). Voltage for powering the primary power wiring network is supplied by an external power supply source; typically, ring structures at the edges of the IC form the backbone of the power distribution system. In order to facilitate signal routing and power distribution, the primary power wiring network is typically implemented by a row pattern of parallel alternating power (vdd) and ground (gnd) stripes aligned in a preferred wiring direction. The preferred wiring directions of successive metal layers are perpendicular to each other. As an example, FIG. 1a shows a detailed view of a metal layer M2 of an integrated circuit 1 on chip 1', with an M2 primary power/ground wiring grid 20 comprising M2 primary power (vdd) stripes 21 and M2 primary ground (gnd) stripes 22 aligned in the Y direction, whereas FIG. 1b shows a detailed view of metal layer M3 of this integrated circuit 1, with an M3 primary power/ground wiring grid 30 comprising M3 primary power (vdd) stripes 31 and M3 primary ground (gnd) stripes 32 aligned in the X direction. The primary power/ground grids 20, 30 shown FIGS. 1a and 1b are geometrical grids, though (generally) they need not be.

Figure 1C:
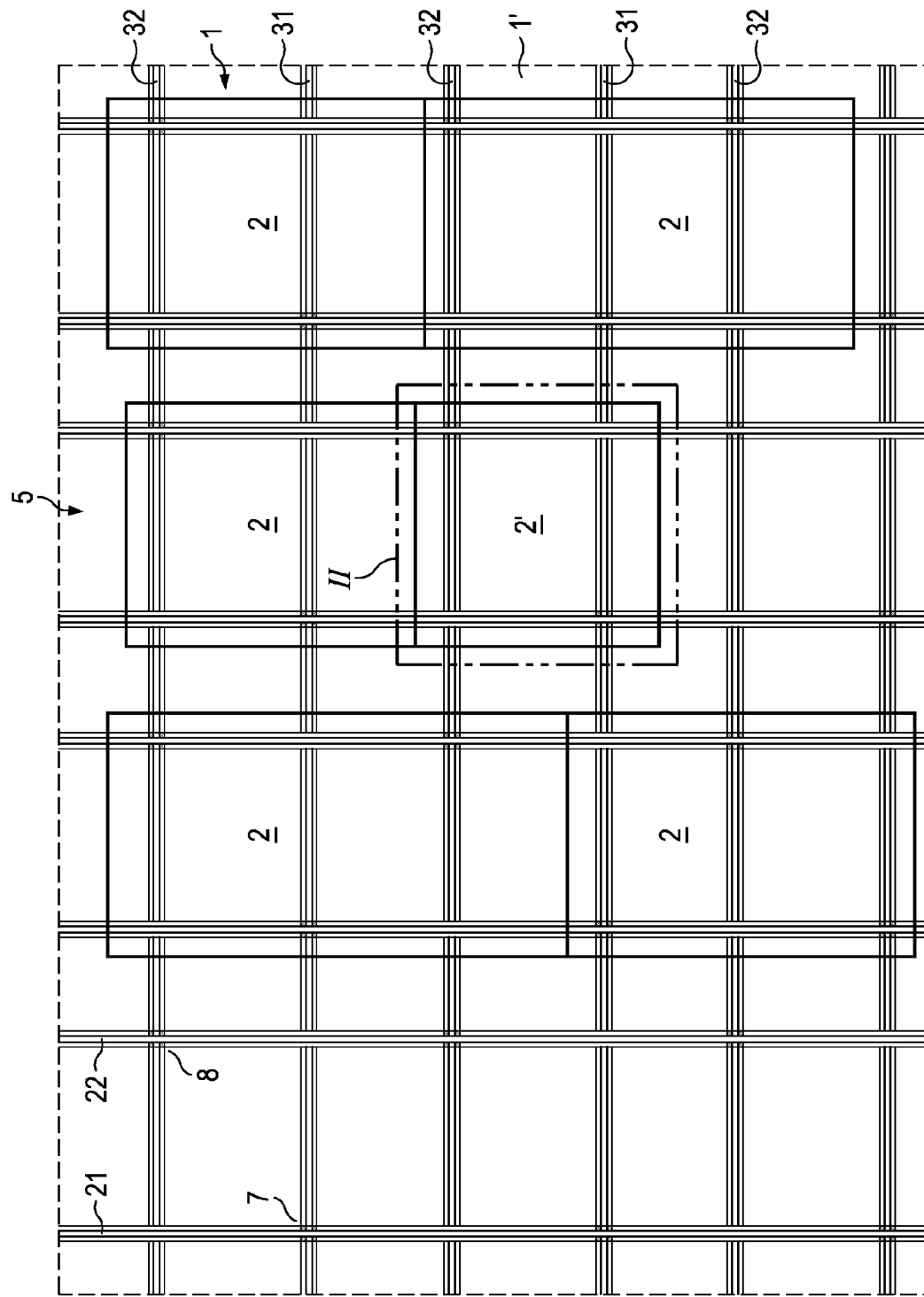
FIG. 1c: a schematic showing a superposition of metal layers M2 and M3 of FIGS. 1a and 1b, as seen from below.

FIG. 1c depicts a projection of the M2 layer on top of the M3 layer, showing how power grids of successive metal layers M2, M3 are arranged with respect to each other. Primary power stripes 21, 31 of successive metal layers M2, M3 are connected by vias 7, and ground stripes 31, 32, of successive metal layers M2, M3 are connected by vias 8. Note that, in order to optimize visibility of features located in metal layer M2, the figures depict the metal layers M2, M3 in reverse order so that the features of metal layer M2 are projected on top of the features of metal layer M3.

Electronic and circuit components constituting the IC design are typically arranged in standard cells 2 of a predetermined (fixed) width 3; the height 4 of the standard cells 2 depends on the contents of the specific cell 2 and thus varies from cell to cell (see FIG. 1). The standard cells 2 are placed in rows 5 extending along the preferred wiring direction of the corresponding metal layer in such a way that the primary power/ground stripes 21, 22 are aligned parallel to this row 5. Each standard cell 2 of a particular row 5 receives a current from the primary power stripe 21 and consumes the current, thus causing a voltage drop (IR drop) in the corresponding primary power stripe 21. In addition, the primary power stripes 21 themselves have resistance, so that cells 2 far away from the edges of the integrated circuit 1 generally receive a reduced supply voltage relative to the supply voltage received by cells 2 near the edge of the integrated circuit 1. If the voltage drop in a certain location 6 on the chip 1' exceeds an acceptable amount, a cell 2' located at this location 6 cannot be supplied as required and may exhibit malfunctions such as a decrease in operational speed. This problem is especially severe for high power cells, i.e. cells with high power consumption.

As an example, assume that metal layer M2 of FIG. 1a feeds a cell 2' which exhibits unacceptably high IR voltage drops; this cell 2' is shown in detail in FIGS. 2a-2d. Furthermore, assume that the additional power requirement of this cell 2' cannot be satisfied by tying this cell's primary power/ground wiring grid 21, 22 to the primary power/ground wiring grid of the metal level M1 situated below (e.g. due to high resistance or large power consumption in this metal level M1 below). In order to solve this problem and to boost the power supply of cell 2', cell 2' is provided with a secondary power supply connected to metal layer M3 above.

Figure 2A:
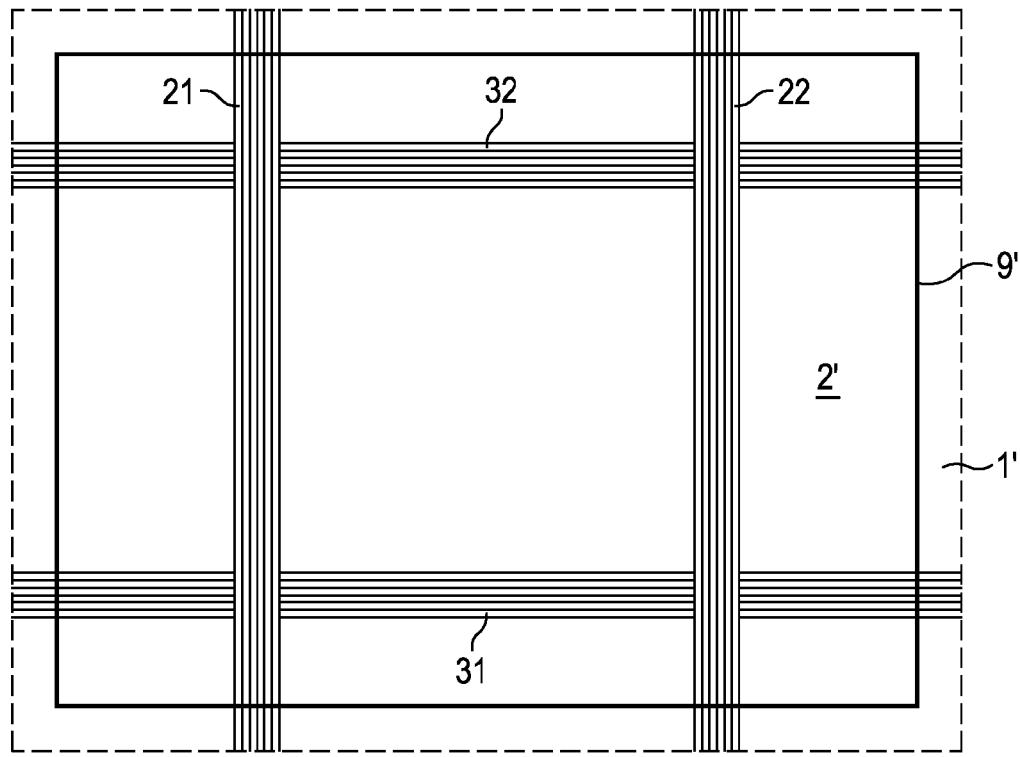
FIG. 2a: a detailed view of region II of FIG. 1c showing primary power/ground grids of metal layers M2, M3 with respect to a standard cell.
Figure 2B:
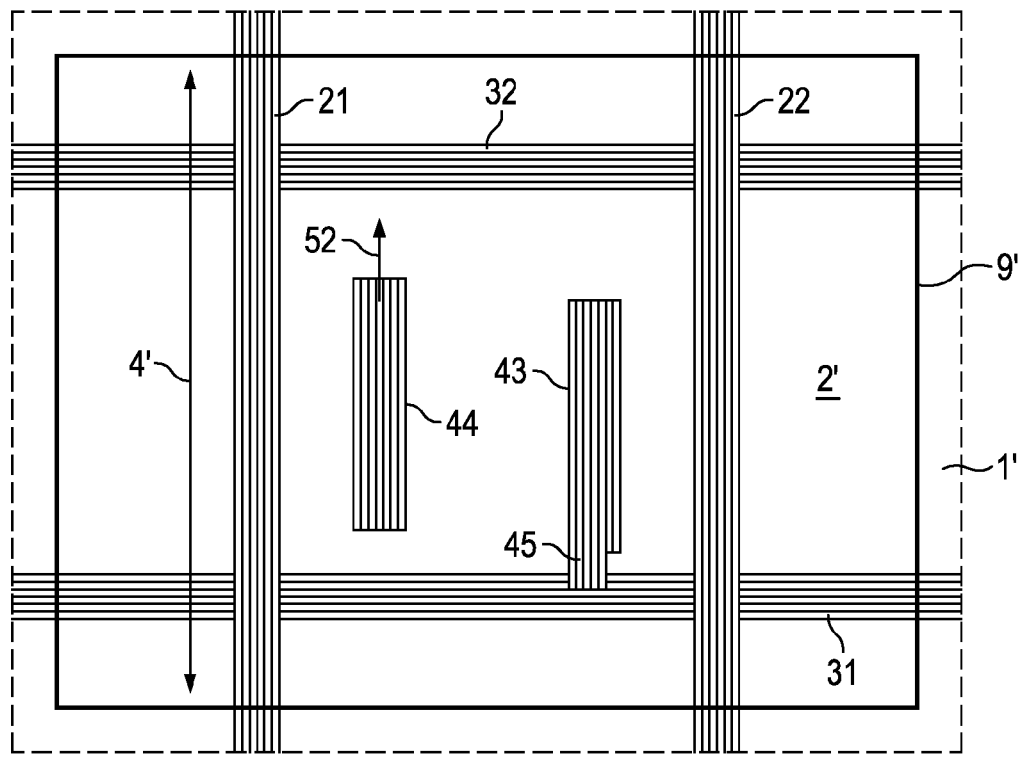
FIG. 2b: the view of FIG. 2a, after placing secondary power/ground pins in metal layer M2.
Figure 2C:
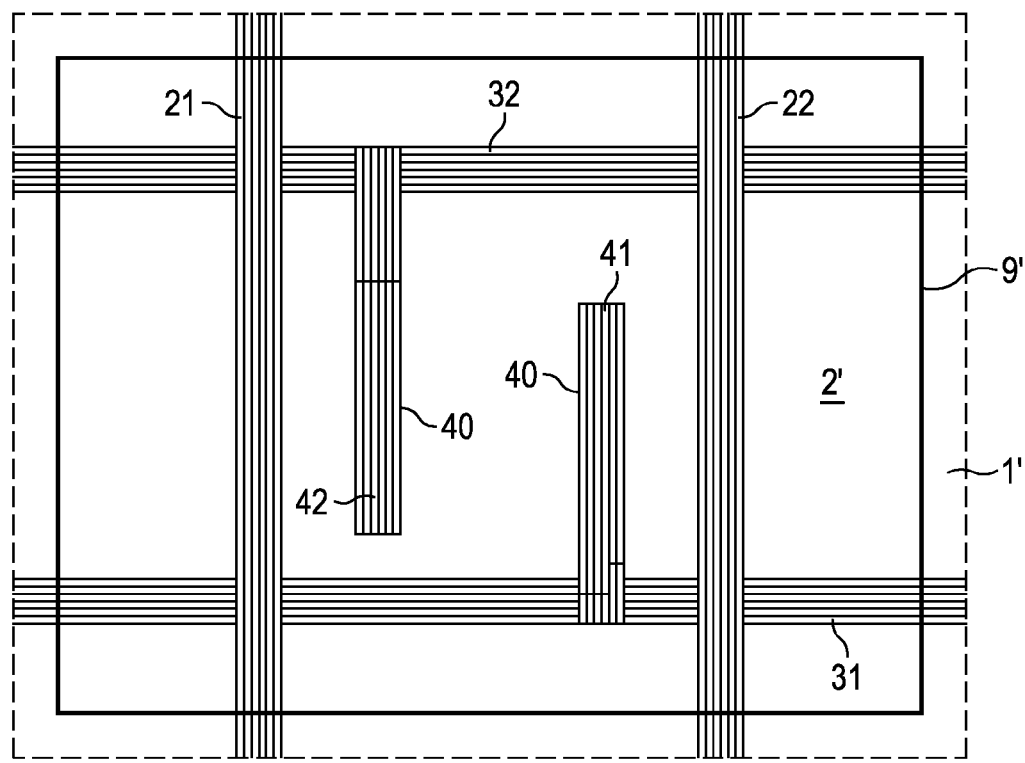
FIG. 2c: the view of FIG. 2b, after extending the secondary power/ground pins into secondary power/ground stripes.
Figure 3A:
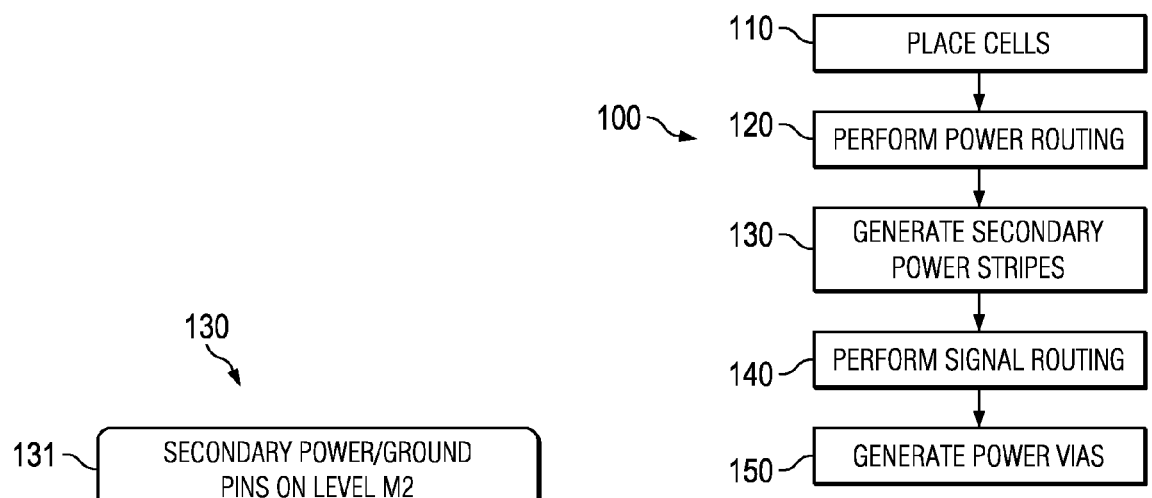
FIG. 3a: a flow diagram of a method for generating a layout for a design of an electronic circuit with multiple metal layers and primary and secondary power/ground grids according to a preferred embodiment of the invention.
Figure 3B:
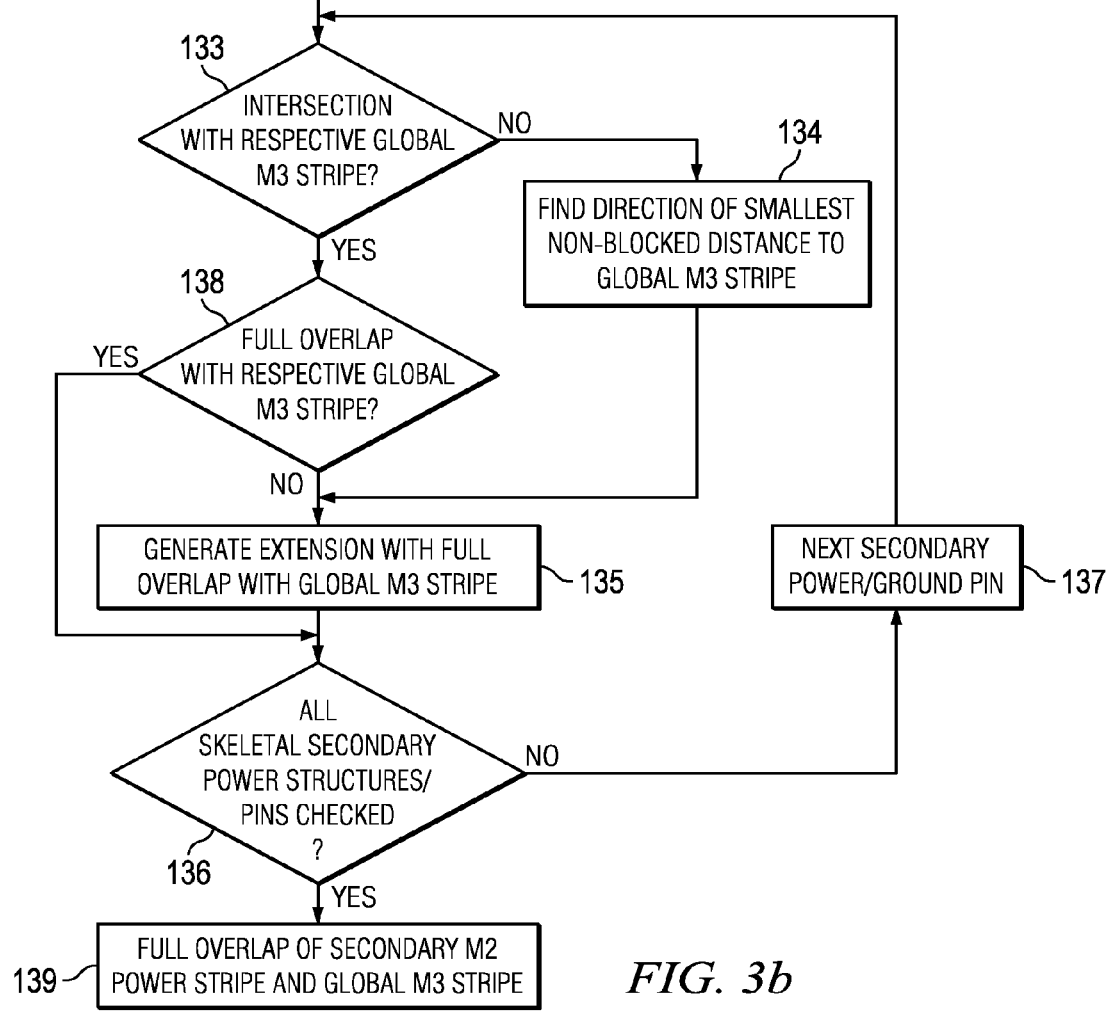

A preferred embodiment of a corresponding method 100 for solving this problem is depicted in the schematic flow diagrams of FIGS. 3a and 3b. The method 100 begins by placing the cells 2 on the chip 1' (step 110) and by routing the primary power/ground grids 20 and 30 of metal layers M2 and M3, respectively (step 120). The result of these placement/routing steps 110, 120 is shown in FIG. 2a. A cell 2' with additional power requirements is designed to have secondary power/ground pins 43 and 44 (see FIG. 2b). The secondary power pins 43 and 44 aim at boosting the voltage of cell 2' by tapping into the primary power/ground wiring grid 30 of the metal level M3 situated above metal layer M2. Note that, in order to ascertain freedom of placement, the secondary power pins 43 and 44 are confined to the corresponding standard cell 2' and must not extend the cell boundary 9'. In order to complete the connections, a secondary power/ground wiring grid 40—comprising a secondary power stripe 41 and a secondary ground stripe 42—is introduced into this cell 2' (see FIG. 2c), the stripes 41, 42 of this secondary power grid 40 being aligned parallel to the stripes 21, 22 of the primary power grid 20 of this layer M2 (step 130).

Note that the secondary power/ground "grid" 40 is actually not a geometric grid, but a more ad hoc distribution. Thus, it is to be understood that the term "secondary power/ground wiring grid" is not meant to define a geometric grid, but is used colloquially to denote this specific distribution of conductors. Step 130 of generating secondary power/ground stripes 41, 42 comprises several substeps, as shown in FIG. 3b.

The location of the stripes 41, 42 of secondary power/ground wiring grid 40 within cell 2' is determined by the location of the cell's secondary power pins 43, 44 within cell 2'. An attempt of connecting these M2 secondary power/ground pins 43, 44 to the primary power grid 30 of successive metal layer M3 will fail unless there is sufficient overlap of the corresponding conducting stripes so that vias can be placed. Note that this overlap cannot be guaranteed, since standard cells 2 of a given metal layer M2 are generally not aligned with the primary power/ground wiring grid 30 of a successive metal layer M3. This is due to the fact that while the width 3 of standard cells 2 is fixed, the height 4 of the standard cells 2 varies. As a consequence, in small cells (such as cell 2'), the cell height may not be large enough to guarantee sufficient intersection with one or both stripes 31, 32 of the power/ground wiring grid 30 of the successive metal layer M3. Thus, situations may occur in which the secondary power/ground pins 43, 44 located in metal layer M2 may not be connected to the primary power/ground wiring grid 30 of a successive metal layer M3. This is the case with the secondary power/ground pins 43, 44 shown in FIG. 2b: The secondary ground pin 44 located in metal layer M2 does not overlap at all with primary ground stripe 32 of metal layer M3, and secondary power pin 43 located in metal layer M2 exhibits only partial overlap 45—insufficient for placing vias—with primary power stripe 31 of metal layer M3.

In order to provide sufficient overlap with primary power/ground wiring of the metal layer M3 above and/or metal layer M1 below, the secondary power/ground pins 43, 44 of level M2 have to be extended. In step 132, an (arbitrary) secondary pin—say secondary ground pin 44—is chosen. Since this secondary ground pin 44 does not overlap with any primary (global) ground stripe 32 of metal layer M3 (step 133), the secondary ground pin's 44 direction 52 of the smallest non-blocked distance to a primary (global) ground stripe 32 of metal layer M3 is determined (step 134), and the secondary ground pin 44 is extended in this direction 52 until full overlap with the primary (global) power stripe 32 of metal layer M3 is achieved (step 135). Preferably, the secondary ground stripe 42 thus formed in metal layer M2 is aligned parallel to the primary ground stripe 22 of this metal layer M2. This is displayed in FIG. 2c.

Subsequently, the secondary power pin 43 is chosen (steps 136 and 137); while this secondary power pin 43 intersects the corresponding (global) power stripe 31 of metal layer M3 (step 133), the overlap 45 is not complete (step 138), and thus the overlapping region 45 of secondary power pin 43 is extended until full overlap has been accomplished, thus generating secondary power stripe 41 (step 135) (see FIG. 2c). Step 130 of method 100 thus ensures that secondary power/ground stripes 41, 42 are generated in metal layer M2 in such a way that they can be appropriately connected to the respective primary (global) power and ground stripes 31, 32 of successive metal M3.

Figure 2D:
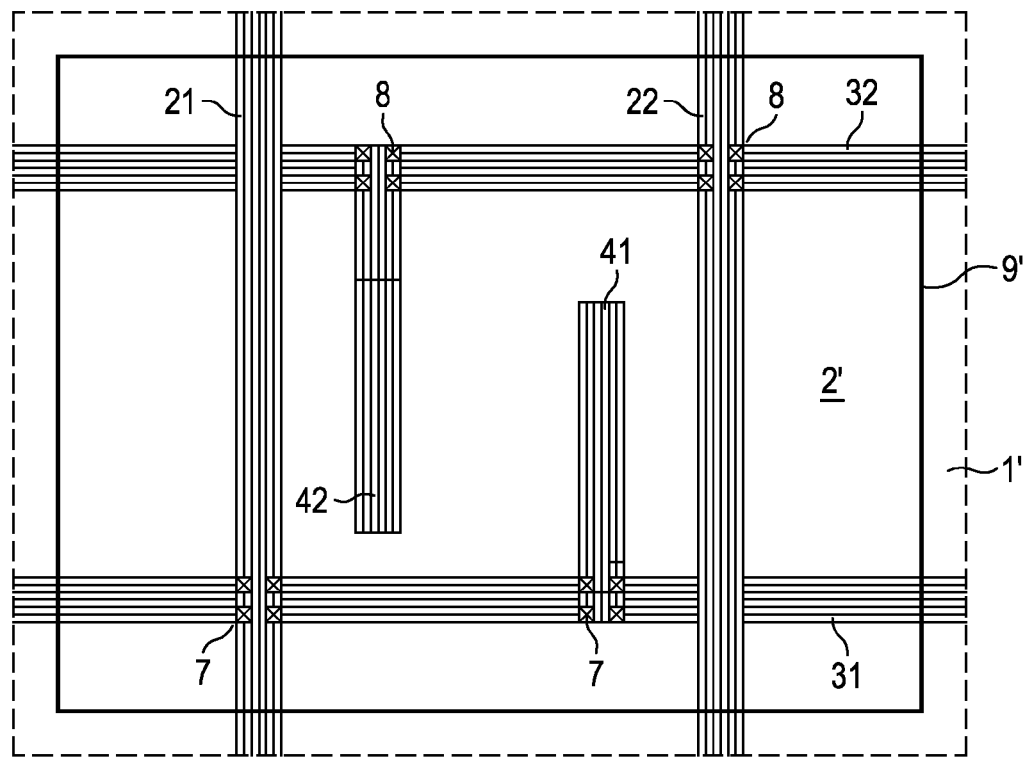
FIG. 2d: the view of FIG. 2c, after connecting the primary and secondary power/ground grids of metal layers M2 and M3 by vias.

Subsequently, signal routing is performed on the design (step 140), and vias 7 between the power stripes 21, 31, 41, as well as vias 8 between ground stripes and 22, 32, 42 of neighboring metal layers M2 and M3, are inserted (step 150). This is shown in FIG. 2d. As these vias 7, 8 are generated, the primary power/ground grid 20 of metal layer M2 snaps into the normal (fixed) power grid, and all additional secondary power/ground stripes 41, 42 generated (and—if need be—extended) in step 130 are connected to primary the power grid. Note that the vias 7, 8 may be inserted before signal routing, so that step 150 precedes step 140. In any case, the secondary power pins 41, 42 are generated/extended (step 130) after power routing (step 120), but before signal routing (step 140).

While the principles of the invention were explained in conjunction with metal layers M2 and M3, the principle is equally applicable to any number of metal layers, any number of power or ground nets and any type of power network structures. Furthermore, the extension method (step 130) is not limited to (secondary) power/ground supply grids; rather, it can be applied to any connection in a regular mesh or grid, e.g. a clock distribution grid. Note that the invention is equally applicable for standard cells arranged in vertical or horizontal rows.

Figure 4:
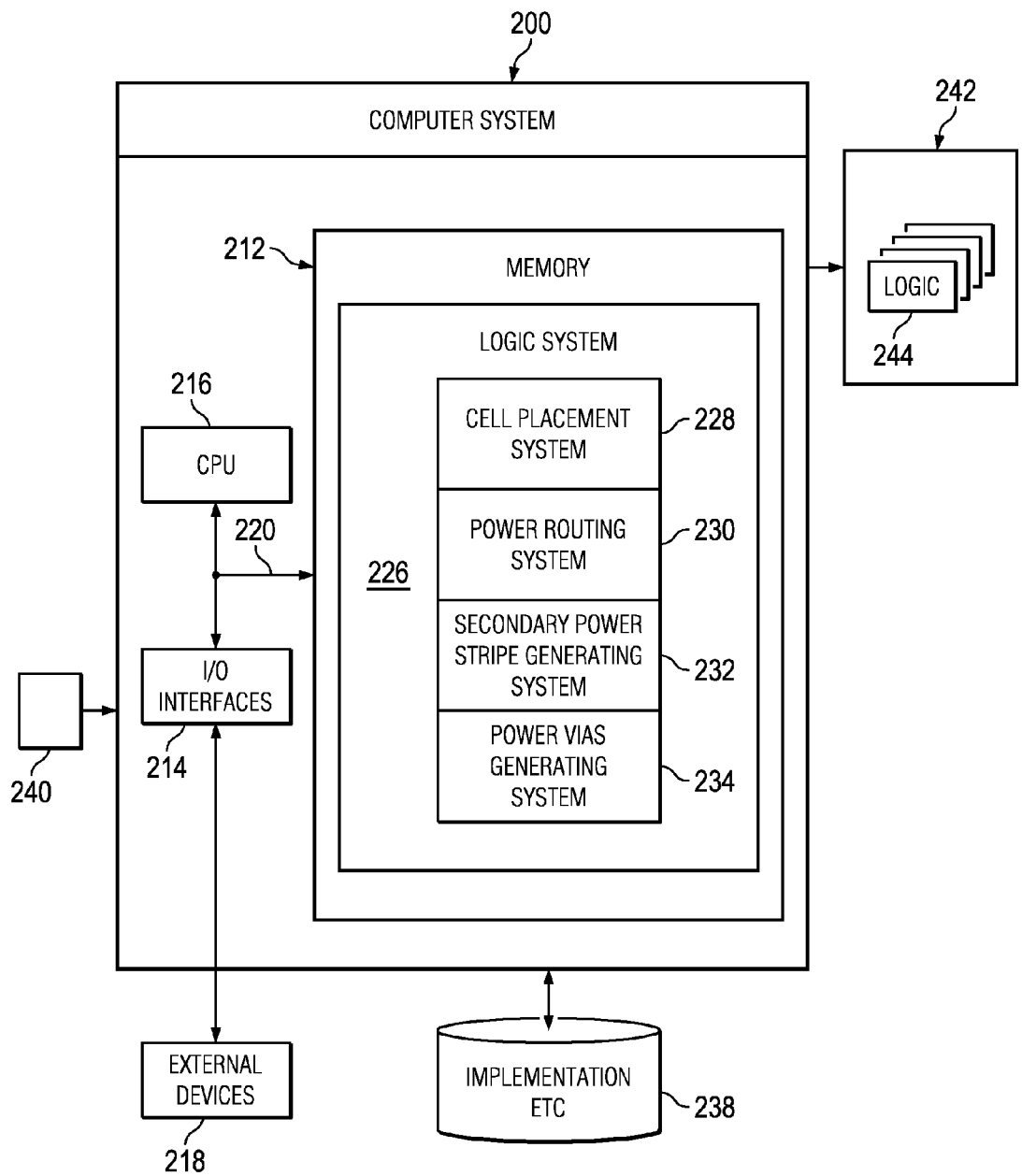
FIG. 4: a computer system implementation of a preferred method for generating an IC design layout.

Referring now to FIG. 4, a computer system 200 implementation of a preferred embodiment of the present invention is shown. Specifically, the present invention can be implemented as a computer system 200 and/or program product for providing a secondary power/ground grid 40 for a cell 2' in an integrated circuit 1 with multiple metal layers M2, M3 in which each metal layer M2, M3 contains a primary grid 20, 30 made up of primary power/ground stripes 21, 22, 31, 32. This allows a user 240, for example a circuit designer, to generate a secondary power/ground grid 40 in a metal layer M2 in such a way that this grid 40 can be successfully connected to a primary grid 30 of a neighboring layer M3.

As depicted, computer system 200 generally comprises memory 212, input/output (I/O) interfaces 214, a central processing unit (CPU) 216, external devices/resources 218, bus 220 and data base 238. Memory 212 may comprise any known type of data storage and/or transmission media, including magnetic media, optical media, random access memory (RAM), read-only memory (ROM), a data cache, a data object etc. Moreover, memory 212 may reside at a single physical location, comprising one or more types of data storage, or can be distributed across a plurality of physical systems in various forms. CPU 216 may likewise comprise a single processing unit, or be distributed across one or more processing units in one or more locations, e.g. on a client and server. I/O interfaces 214 may comprise any system for exchanging information from an external source. External devices 218 may comprise any known type of external device, including keyboard, mouse, voice recognition system, printer, monitor, facsimile etc. Bus 220 provides a communication link between each of the components in the computer system 200 and likewise may comprise any known type of transmission link, including electrical, optical, wireless etc. In addition, although not shown, additional components such as cache memory, communication systems, system software etc. may be incorporated into computer system 200.

Database 238 provides storage for information necessary to carry out the present invention. Such information could include e.g. a netlist of the IC design, information on IR drop across the various metal layers of the integrated circuit, etc. Database 238 may include one or more storage devices, such as a magnetic disk drive or an optical disk drive. In another embodiment, database 238 includes data distributed across, for example, a local area network (LAN), wide area network (WAN) or a storage area network (SAN). Database 238 may also be configured in such a way that one of ordinary skill in the art may interpret it to include one or more storage devices. Moreover, it should be understood that database 238 could alternatively exist within computer system 200.

Stored in memory 212 is logic system 226. As depicted, logic system 226 generally includes a Cell Placement System 228, a Primary Power Routing System 230, a Secondary Power Stripe Generating System 232 and a Power Vias Generating System 234. The systems shown herein carry out the functions described above: Cell Placement System 228 is used for placing cells 2 in the design 1. Primary Power Routing System 230 is used for placing primary power/ground stripes corresponding to primary power/ground grids 20, 30. Secondary Power Stripe Generating System 232 is used for providing secondary power/ground stripes 41, 42 in at least one cell 2', such that each secondary power stripe 41, 42 in a metal layer M2 exhibits a full overlap with a stripe 31, 32 of a corresponding primary power/ground grid 30 in a neighboring metal layer M3. Power Vias Generating System 234 is used for placing vias 7, 8 connecting the primary power/ground grids 20, 30 to the secondary power/ground stripes 41, 42.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by on in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

What is claimed is:

1. A method for providing a secondary grid for a cell in an integrated circuit with multiple metal layers, each metal layer of the multiple metal layers containing a primary grid made up of primary stripes, the method comprising the steps of:
   generating a secondary stripe in a given metal layer of the multiple metal layers such that said secondary stripe exhibits a full overlap with a primary stripe of a primary grid of a different metal layer using a computer; and
   placing vias for connecting each secondary stripe to the primary grid of the different metal layer, characterized in that the step of generating a secondary stripe comprises extending a previously established secondary pin of said cell into a secondary stripe such that the secondary stripe exhibits a full overlap with a primary stripe of a primary grid of a different metal layer.

2. The method according to claim 1, characterized in that the secondary pin is extended in the direction of the smallest non-blocked distance to the primary grid of the different metal layer.

3. The method according to claim 2, characterized in that the secondary pin is extended parallel to the primary grid direction of the metal layer of the secondary pin.

4. The method according to claim 1, characterized in that:
   the primary grid is a primary power/ground grid; and
   the secondary grid is a secondary power/ground grid confined to the cell.

5. A method for generating a layout for a design of an electronic circuit with multiple metal layers and multiple cells, comprising the steps of:
   placing the multiple cells and stripes of a primary power/ground grid for said design;
   providing at least one cell of the multiple cells with secondary power stripes such that each secondary power/ground stripe exhibits a full overlap with a stripe of a corresponding primary power/ground grid in a different metal layer;
   routing signals from said design; and generating power vias between said stripes and said secondary power/ground stripes using a computer, characterized in that the step of providing secondary power stripes comprises the steps of:

providing secondary power pins; and extending the secondary power pins into secondary power stripes such that each secondary power/ground stripe exhibits a full overlap with a stripe of a corresponding primary power/ground grid in a different metal layer.

6. The method according to claim 5, characterized in that the step of generating power vias is performed before the signal routing step.

7. A system for generating a layout for a design of an electronic circuit with multiple metal layers and multiple cells, comprising:

a Cell Placement System for placing said multiple cells;

a Primary Power Routing System for placing primary power/ground stripes corresponding to a primary power/ground grid;

a Secondary Power Stripe Generating System for providing secondary power/ground stripes in at least one cell, such that each secondary power stripe exhibits a full overlap with a stripe of a corresponding primary power/ground grid in a different metal layer; and a Power Vias Generating System for placing vias connecting said stripes to said secondary power/ground stripes, characterized in that the Secondary Power Stripe Generating System:

provides secondary power pins; and extends the secondary power pins into the secondary power stripes such that each secondary power/ground stripe exhibits a full overlap with a stripe of a corresponding primary power/ground grid in a different metal layer.

8. The system according to claim 7, characterized in that:

the primary grid is a primary power/ground grid; and the secondary grid is a secondary power/ground grid confined to the cell.

9. A data processing system for generating a layout for a design of an electronic circuit with multiple metal layers and multiple cells, comprising a machine readable medium containing one or more programs which when executed perform the steps of:

placing said multiple cells;

placing primary power/ground stripes corresponding to a primary power/ground grid;

generating secondary power/ground stripes such that each secondary power stripe exhibits a full overlap with a stripe of a corresponding primary power/ground grid in a different metal layer; and generating vias connecting said stripes to said secondary power/ground stripes, characterized in that the step of generating secondary power stripes comprises the steps of:

providing secondary power pins; and extending the secondary power pins into the secondary power stripes such that each secondary power/ground stripe exhibits a full overlap with a stripe of a corresponding primary power/ground grid in a different metal layer.

10. A data processing program stored on a non-transitory computer usable medium comprising computer readable program means to generate a layout for a design of an electronic circuit with multiple metal layers and multiple cells, wherein the computer readable program when executed on a computer causes the computer to:

place said multiple cells;

place primary power/ground stripes corresponding to a primary power/ground grid;

generate secondary power/ground stripes such that each secondary power stripe exhibits a full overlap with a stripe of a corresponding primary power/ground grid in a different metal layer; and generate vias connecting said stripes to said secondary power/ground stripes, characterized in that the step to generate secondary power stripes comprises the steps of:

providing secondary power pins; and extending the secondary power pins into the secondary power stripes such that each secondary power/ground stripe exhibits a full overlap with a stripe of a corresponding primary power/ground grid in a different metal layer.

11. A program product comprising a non-transitory computer useable medium including a computer readable program, wherein the computer readable program when executed on a computer causes the computer to:

place cells of a design of an electronic circuit with multiple metal layers and multiple cells;

place primary power/ground stripes corresponding to a primary power/ground grid;

generate secondary power/ground stripes such that each secondary power stripe exhibits a full overlap with a stripe of a corresponding primary power/ground grid in a different metal layer; and generate vias connecting said primary power/ground grid stripes to said secondary power/ground stripes, characterized in that the step to generate secondary power stripes comprises the steps of:

providing secondary power pins; and extending the secondary power pins into the secondary power stripes such that each secondary power/ground stripe exhibits a full overlap with a stripe of a corresponding primary power/ground grid in a different metal layer.

* * * * *